United States Patent
Hamaoka et al.

(10) Patent No.: US 8,084,915 B2
(45) Date of Patent: Dec. 27, 2011

(54) SURFACE ACOUSTIC WAVE RESONATOR HAVING COMB ELECTRODES WITH DIFFERENT OVERLAPPING LENGTHS

(75) Inventors: Yosuke Hamaoka, Osaka (JP); Hidekazu Nakanishi, Osaka (JP); Hiroyuki Nakamura, Osaka (JP); Rei Goto, Osaka (JP)

(73) Assignee: Panasonic Corporation, Osaka (JP)

( * ) Notice: Subject to any disclaimer, the term of this patent is extended or adjusted under 35 U.S.C. 154(b) by 356 days.

(21) Appl. No.: 12/513,903

(22) PCT Filed: Nov. 7, 2007

(86) PCT No.: PCT/JP2007/071626
§ 371 (c)(1),
(2), (4) Date: May 7, 2009

(87) PCT Pub. No.: WO2008/056697
PCT Pub. Date: May 15, 2008

(65) Prior Publication Data
US 2010/0060103 A1 Mar. 11, 2010

(30) Foreign Application Priority Data
Nov. 8, 2006 (JP) .................................. 2006-302346

(51) Int. Cl.
*H03H 9/25* (2006.01)
*H03H 9/145* (2006.01)
(52) U.S. Cl. ..................................... 310/313 C; 333/195
(58) Field of Classification Search .................. 333/187, 333/195
See application file for complete search history.

(56) References Cited

U.S. PATENT DOCUMENTS

| | | | |
|---|---|---|---|
| 3,768,032 A * | 10/1973 | Mitchell | 333/154 |
| 4,464,597 A * | 8/1984 | Setsune | 310/313 B |
| 5,877,662 A * | 3/1999 | Kobayashi et al. | 333/195 |
| 6,271,617 B1 | 8/2001 | Yoneda et al. | |
| 6,424,240 B1 * | 7/2002 | Yoshikawa | 333/195 |
| 7,078,989 B2 * | 7/2006 | Inoue et al. | 333/195 |
| 7,339,304 B2 * | 3/2008 | Kadota et al. | 310/313 A |
| 7,479,855 B2 * | 1/2009 | Yata | 333/196 |
| 7,569,971 B2 * | 8/2009 | Andle et al. | 310/313 D |
| 7,579,928 B2 * | 8/2009 | Otsuka et al. | 333/133 |
| 7,646,266 B2 | 1/2010 | Igaki et al. | |
| 7,728,699 B2 * | 6/2010 | Fujii et al. | 333/196 |
| 2001/0011932 A1 | 8/2001 | Takamiya et al. | |
| 2002/0140316 A1 | 10/2002 | Yamanouchi | |

(Continued)

FOREIGN PATENT DOCUMENTS

DE 11 2004 001 841 T5 9/2006

(Continued)

OTHER PUBLICATIONS

Machine translation of JP 5-129872, May 1993.

(Continued)

*Primary Examiner* — Jaydi San Martin
(74) *Attorney, Agent, or Firm* — Wenderoth Lind & Ponack, L.L.P.

(57) ABSTRACT

A surface acoustic wave resonator includes a piezoelectric substrate, a first surface acoustic wave resonator having a comb electrode provided on the piezoelectric substrate, and a second surface acoustic wave resonator having a comb electrode provided on the piezoelectric substrate. The first surface acoustic wave resonator and the second surface acoustic wave resonator are apodized and connected in parallel.

5 Claims, 6 Drawing Sheets

U.S. PATENT DOCUMENTS

2008/0266027 A1* 10/2008 Yata .............................. 333/195
2010/0097161 A1* 4/2010 Nakamura et al. ............ 333/133

FOREIGN PATENT DOCUMENTS

| EP | 533431 | A1 | * | 3/1993 |
|---|---|---|---|---|
| EP | 2066026 | A1 | * | 6/2009 |
| JP | 60154706 | A | * | 8/1985 |
| JP | 63-260213 | | | 10/1988 |
| JP | 63260213 | A | * | 10/1988 |
| JP | 2-11012 | | | 1/1990 |
| JP | 5-129872 | | | 5/1993 |
| JP | 6-85602 | | | 3/1994 |
| JP | 07162261 | A | * | 6/1995 |
| JP | 08321740 | A | * | 12/1996 |
| JP | 09205341 | A | * | 8/1997 |
| JP | 11-088100 | | | 3/1999 |
| JP | 2003-209458 | | | 7/2003 |
| WO | 2005/107069 | | | 11/2005 |

OTHER PUBLICATIONS

Machine translation of JP 6-085602, Mar. 1994.
Partial English translation of JP 63-260213, Oct. 1988.
International Search Report issued Dec. 18, 2007 in International (PCT) Application No. PCT/JP2007/071626.
Supplementary European Search Report issued Nov. 5, 2009 in corresponding EP Application No. EP 07831357.
Lee, Ru-Yue, et al., *"Design of DCS Duplexer Using SAW Ladder Filter"*, Intelligent Signal Processing and Communication Systems, 2004. ISPACS 2004. Proceedings of 2004 International Symposium on Seoul, Korea, Nov. 18-19, 2004, Piscataway, NJ, USA, IEEE, Nov. 18, 2004, pp. 754-757.

* cited by examiner

SURFACE ACOUSTIC WAVE RESONATOR HAVING COMB ELECTRODES WITH DIFFERENT OVERLAPPING LENGTHS

BACKGROUND OF THE INVENTION

1. Technical Field

The present invention relates to surface acoustic wave resonators used for telecommunications devices of high frequency bands such as mobile phones.

2. Background Art

There is a rising demand in recent years for surface acoustic wave resonators having filtering characteristics over wide frequency bands. In order to produce wide frequency band filters, it is generally necessary to choose substrates made of a material having a large electromechanical coupling coefficient.

$LiNbO_3$ substrates used conventionally are effective for widening frequency bands of the surface acoustic wave filters because of the large electromechanical coupling coefficient. In general, however, $LiNbO_3$ substrates degrade the in-band frequency characteristics due to spurious responses caused by resonance in the transverse mode peculiar to them.

FIG. 8 shows a plan view of a conventional surface acoustic wave resonator provided with normal type electrodes. In normal type electrode 3 having comb electrodes 1 and reflectors 2 as shown in FIG. 8, there occur spurious responses attributed to the resonance in the transverse mode. FIG. 9A and FIG. 9B represent a characteristic of a typical case stated above. That is, FIG. 9A shows a pass-band characteristic, which plots insertion loss versus frequency of the surface acoustic wave resonator of FIG. 8, and FIG. 9B shows a part of the pass-band characteristic of the surface acoustic wave resonator, wherein domain 9b encircled by a dotted line in FIG. 9A is enlarged.

As can be seen from FIG. 9A and FIG. 9B, there occur spurious responses between resonance point 9c and anti-resonance point 9d. There is a technique generally known to suppress the spurious responses caused by the resonance in the transverse mode, which is to apodize the surface acoustic wave resonator as illustrated in FIG. 10. That is, FIG. 10 shows a plan view of a conventional surface acoustic wave resonator of different type from that of FIG. 8. This surface acoustic wave resonator is formed into a so-called apodized configuration, in which overlapping lengths of interdigitated electrode fingers of two comb electrodes 1 are varied as shown in FIG. 10 to obtain a desired frequency characteristic.

Patent references 1 and 2 are examples of the prior art documents known to be related to the above technique.

Although the apodization is effective to suppress the resonance in the transverse mode of comb electrodes 1 having a small number of electrode fingers as shown in FIG. 10, it is not feasible to suppress spurious responses if comb electrodes 1 have a large number of electrode fingers as is the case of another conventional surface acoustic wave resonator shown in FIG. 11 since it bears a high amplitude of excitation in the transverse mode.

FIG. 12A shows a pass-band characteristic of a surface acoustic wave resonator provided with comb electrodes having 150 apodized electrode fingers, and FIG. 12B shows a part of the pass-band characteristic of the surface acoustic wave resonator, wherein domain 12b encircled by a dotted line in FIG. 12A is enlarged.

It is apparent from the pass-band characteristic shown in FIG. 12A and FIG. 12B that the spurious responses by the resonance in the transverse mode are reduced as compared to that of FIG. 9A and FIG. 9B.

FIG. 13A shows a pass-band characteristic of another surface acoustic wave resonator provided with comb electrodes having 300 apodized electrode fingers, and FIG. 13B shows a part of the pass-band characteristic of the surface acoustic wave resonator, wherein domain 13b encircled by a dotted line in FIG. 13A is enlarged.

The surface acoustic wave resonator featuring the pass-band characteristic shown in FIG. 13A and FIG. 13B has such a structure that comb electrodes are formed on a $LiNbO_3$ substrate, and surfaces of the comb electrodes and the $LiNbO_3$ substrate are covered with a thin film of silicon dioxide (hereinafter referred to as "$SiO_2$"). The substrate used here is a rotated Y-cut substrate having a cut angle of 5 degrees. Although adoption of this structure can help widen a bandwidth and improve a temperature characteristic of the surface acoustic wave resonator, it is not effective to suppress the spurious responses attributed to the resonance in the transverse mode when the number of electrode fingers of the comb electrodes is increased to about 300, for instance. When such a surface acoustic wave resonator is used to compose a ladder type filter, it is necessary in design to increase a capacitance of the surface acoustic wave resonator. However, this gives rise to a problem that spurious responses are liable to occur when the number of electrode fingers of comb electrodes 1 is increased to obtain a large capacitance.

[Patent Document 1] Japanese Patent Unexamined Publication, No. 1990-11012

[Patent Document 2] Japanese Patent Unexamined Publication, No. 1994-85602

SUMMARY OF THE INVENTION

The present invention is intended to solve the above problem, and to provide a surface acoustic wave resonator featuring a wide frequency band with spurious responses suppressed even when a capacitance is increased by providing comb electrodes with a large number of electrode fingers.

The surface acoustic wave resonator of the present invention includes a piezoelectric substrate, a first surface acoustic wave resonator having a comb electrode provided on the piezoelectric substrate, and a second surface acoustic wave resonator having a comb electrode also provided on the piezoelectric substrate. Both of the first surface acoustic wave resonator and the second surface acoustic wave resonator have an apodized configuration, and they are connected in parallel.

Since the above structure uses two surface acoustic wave resonators, each having a smaller number of comb electrode fingers, it can suppress undesired resonance in the transverse mode to thereby prevent spurious responses. The structure can also provide a desired value of electrostatic capacitance since it makes use of the first surface acoustic wave resonator and the second surface acoustic wave resonator in parallel connection.

Accordingly, the present invention can provide the surface acoustic wave resonator having the desired value of electrostatic capacitance while preventing the spurious responses even with a large number of the comb electrode fingers in the aggregate.

REFERENCE MARKS IN THE DRAWINGS

10 Piezoelectric substrate
11, 12, 21a and 22a Comb electrode
13, 14, 15, 16, 21b, 21c, 22b and 22c Reflector
20 and 21 First surface acoustic wave resonator
22 and 30 Second surface acoustic wave resonator

DETAILED DESCRIPTION OF THE INVENTION

Description is provided hereinafter of some exemplary embodiments according to the present invention with reference to the accompanying drawings. It is to be noted that electrode fingers shown in the following drawings are less than actual numbers for the purpose of simplifying their structures. Also note that like reference marks are used throughout to designate like elements, and details of them may be skipped.

First Exemplary Embodiment

Figure 1:
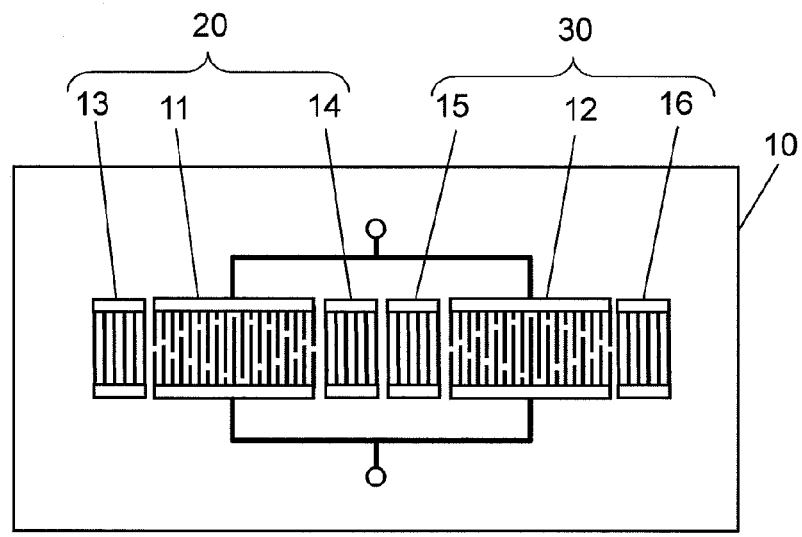
FIG. 1 is a plan view of a surface acoustic wave resonator according to a first exemplary embodiment of the present invention.

FIG. 1 shows a plan view of a surface acoustic wave resonator according to the first exemplary embodiment of the present invention.

As shown in FIG. 1, the surface acoustic wave resonator of the first exemplary embodiment includes piezoelectric substrate 10, first surface acoustic wave resonator 20 having comb electrodes 11 provided on piezoelectric substrate 10, and second surface acoustic wave resonator 30 having comb electrodes 12 provided on piezoelectric substrate 10. First surface acoustic wave resonator 20 and second surface acoustic wave resonator 30 have an apodized configuration as shown in FIG. 1, and they are connected in parallel.

In other words, the surface acoustic wave resonator shown in the first exemplary embodiment is comprised of comb electrodes 11 and 12, and reflectors 13, 14, 15 and 16, all formed on piezoelectric substrate 10 made of a material such as $LiNbO_3$. Reflectors 13 and 14 are disposed in close proximity to both sides of comb electrodes 11 to compose first surface acoustic wave resonator 20 as shown in FIG. 1. Likewise, reflectors 15 and 16 are disposed in close proximity to both sides of comb electrodes 12 to compose second surface acoustic wave resonator 30. In addition, the surface acoustic wave resonator shown in the first exemplary embodiment is so configured that first surface acoustic wave resonator 20 and second surface acoustic wave resonator 30 are connected in parallel.

Both comb electrodes 11 and 12 are apodized into such a configuration that overlapping lengths of their interdigitated electrode fingers are gradually reduced from the largest at the center toward both ends of the resonators where the electrode fingers are not overlapped. Here, the term apodization refers to a technique in designing the surface acoustic wave resonator to obtain a desired frequency characteristic by varying overlapping lengths of the electrode fingers. Incidentally, in this surface acoustic wave resonator, it is preferable to use $LiNbO_3$ for piezoelectric substrate 10 in order to obtain a filtering characteristic of wider frequency band since it provides a larger electromechanical coupling coefficient than that of $LiTaO_3$. The above structure adopted in the surface acoustic wave resonator can achieve a wideband characteristic with low spurious responses.

Figure 2A:
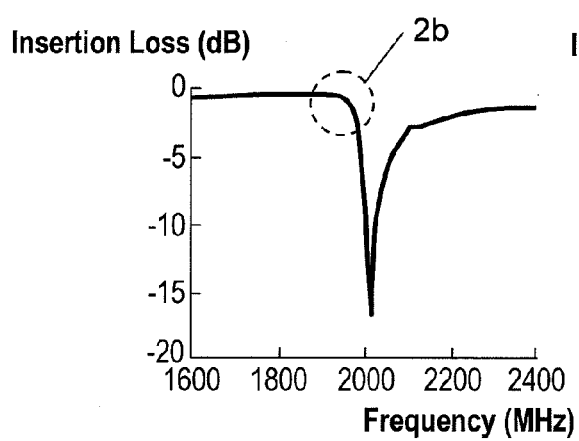
FIG. 2A is a pass-band characteristic of the surface acoustic wave resonator according to the first exemplary embodiment of the present invention.

FIG. 2A shows a pass-band characteristic of the surface acoustic wave resonator produced as discussed above, and FIG. 2B shows a part of the pass-band characteristic, wherein domain 2b encircled by a dotted line in FIG. 2A is enlarged.

By way of example, piezoelectric substrate 10 used here is a rotated Y-cut substrate having a cut angle of 5 degrees, and comb electrodes 11 and 12 are formed on this $LiNbO_3$ substrate covered with a film of silicon oxide such as $SiO_2$. In other words, a dielectric layer made of the silicon oxide film is formed over the comb electrodes. This structure helps widen the frequency bandwidth and improve the temperature characteristic of the resonator. Although the piezoelectric substrate used here is a rotated Y-cut substrate of 5-degree cut angle, the surface acoustic wave resonator can be produced by using a rotated Y-cut substrate of $LiNbO_3$ having any cut angle within a range of −5 to +30 degrees. The piezoelectric substrate of a high electromechanical coupling coefficient can be thus obtained by processing the rotated Y-cut of a cut angle within the range specified above, thereby making the surface acoustic wave resonator adaptable for a wideband filter. It is especially desirable to use the piezoelectric substrate, of which the rotated Y-cut angle is inside the range of −5 and +30 degrees, since this can provide the piezoelectric substrate with a high electromechanical coupling coefficient.

Figure 11:
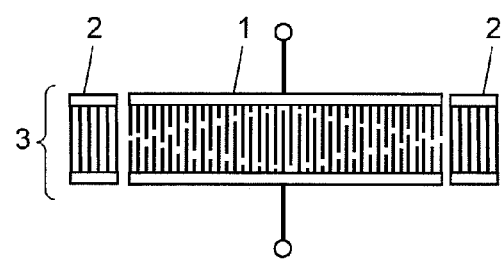
FIG. 11 is a plan view of still another conventional surface acoustic wave resonator provided with comb electrodes having a large number of electrode fingers.
Figure 12A:
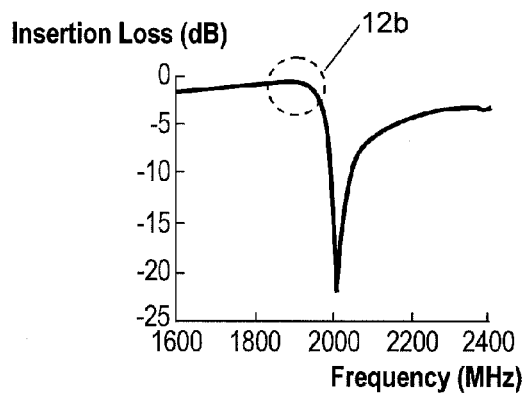
FIG. 12A is a pass-band characteristic of a surface acoustic wave resonator provided with comb electrodes having 150 apodized electrode fingers.
Figure 12B:
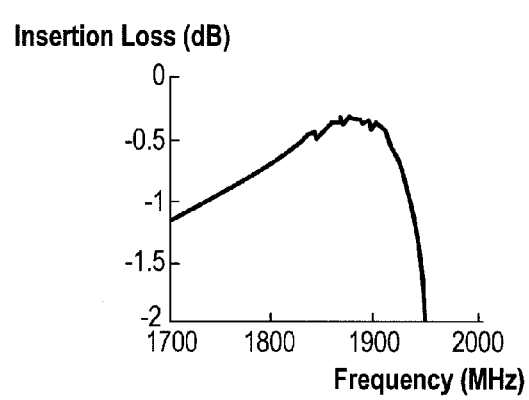
FIG. 12B is a part of the pass-band characteristic of the surface acoustic wave resonator, wherein domain 12b encircled by a dotted line in FIG. 12A is enlarged.
Figure 13A:
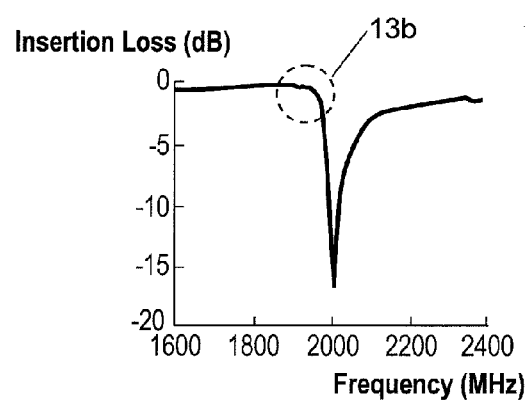
FIG. 13A is a pass-band characteristic of a surface acoustic wave resonator provided with comb electrodes having 300 apodized electrode fingers.
Figure 13B:
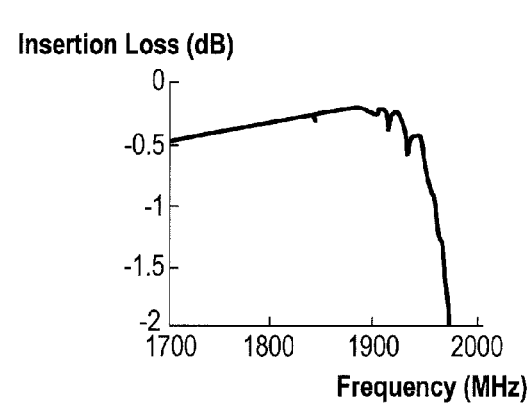
FIG. 13B is a part of the pass-band characteristic of the surface acoustic wave resonator, wherein domain 13b encircled by a dotted line in FIG. 13A is enlarged.

Comb electrodes 11 and 12 are provided with 150 each of electrode fingers so as to make the surface acoustic wave resonator in s a complete device become equivalent in value of the electrostatic capacitance to that of the conventional surface acoustic wave resonator having 300 fingers of the comb electrodes shown in FIG. 11.

Figure 2B:
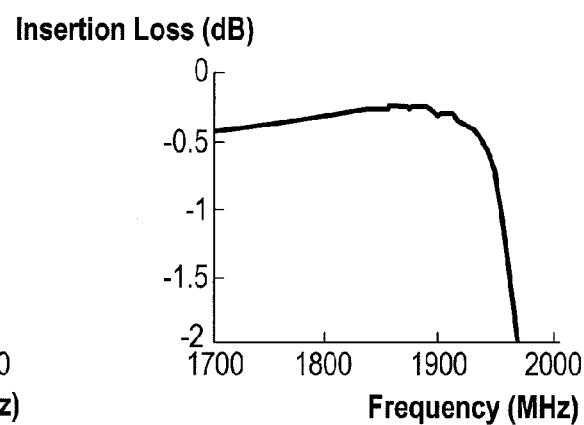
FIG. 2B is a part of the pass-band characteristic, wherein domain 2b encircled by a dotted line in FIG. 2A is enlarged.

As is obvious from FIG. 2A and FIG. 2B, it is known that the embodied structure can suppress the spurious responses that are normally found around the resonance point without adversely influencing the insertion loss. This is attributed to the use of first surface acoustic wave resonator 20 and second surface acoustic wave resonator 30 having comb electrodes 11 and 12 each provided with the smaller number of the electrode fingers, which work effectively to suppress the undesired resonances in the transverse mode. It is also because of the large electrostatic capacitance of the complete surface acoustic wave resonator obtained by the parallel connection between first surface acoustic wave resonator 20 and second surface acoustic wave resonator 30.

Adoption of the above structure can hence realize the surface acoustic wave resonator of large capacitance while also suppressing the spurious responses. Accordingly, it can be anticipated that the invention provide an advantage effect of increasing a degree of flexibility in designing ladder type filters.

Figure 3:
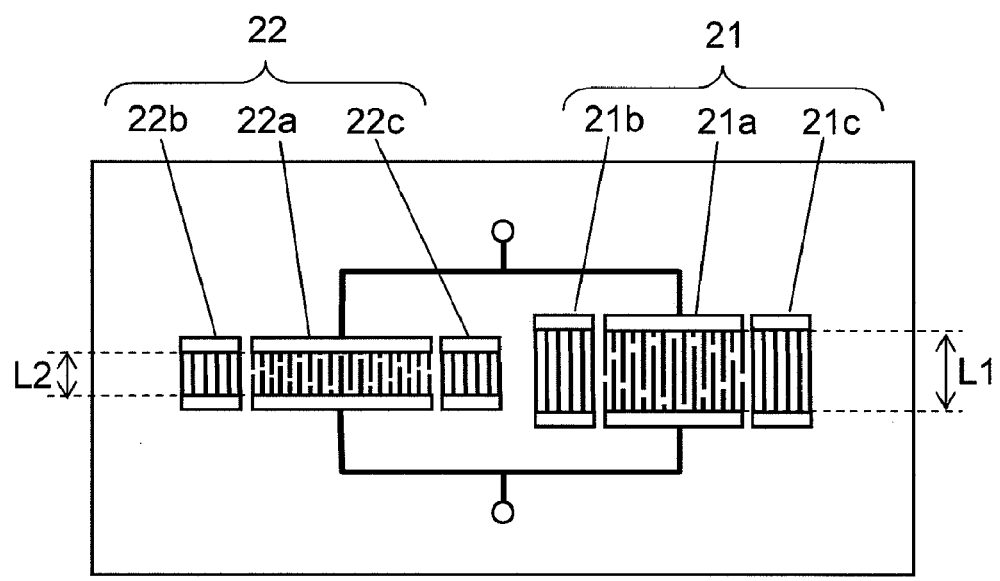
FIG. 3 is a plan view of another surface acoustic wave resonator according to the first exemplary embodiment of the present invention.

FIG. 3 shows a plan view of another surface acoustic wave resonator according to the first exemplary embodiment. This surface acoustic wave resonator includes first surface acoustic wave resonator 21 and second surface acoustic wave resonator 22, which are connected in parallel in the same fashion as FIG. 1. First surface acoustic wave resonator 21 includes comb electrodes 21a and reflectors 21b and 21c disposed in a manner to sandwich comb electrodes 21a. Second surface acoustic wave resonator 22 includes comb electrodes 22a and reflectors 22b and 22c also disposed in a manner to sandwich comb electrodes 22a.

In first surface acoustic wave resonator 21 and second surface acoustic wave resonator 22, comb electrodes 21a and 22a are formed different in their overlapping lengths L1 and L2 such that they have a relation of L1>L2, as shown in FIG. 3, to obtain the following advantage.

Spurious response to resonance in the transverse mode discussed here referred to the spurious response that occurs within the passing frequency band due to standing waves developed in a direction orthogonal to the propagating direction X of elastic waves. A frequency of the spurious response in the transverse mode is therefore dependent upon the overlapping lengths L1 and L2 of comb electrodes 21a and 22a of first surface acoustic wave resonator 21 and second surface acoustic wave resonator 22. In this structure, the overlapping lengths L1 and L2 are set to have the relation of L1>L2 to differentiate the resonance frequencies in the transverse mode between first surface acoustic wave resonator 21 and second surface acoustic wave resonator 22, so as to separate the spurious responses to the transverse mode resonances. This helps suppress a magnitude of the spurious responses in a specific frequency band. It becomes possible to realize the surface acoustic wave resonator featuring a superior resonance characteristic while also achieving further reduction of the insertion loss by virtue of using this method of differentiating the overlapping lengths for suppression of the spurious responses in combination with the design of apodization for suppressing the spurious responses to the transverse mode resonances.

In this first exemplary embodiment, what have been discussed are exemplified structures, in which both the first surface acoustic wave resonator and the second surface acoustic wave resonator are provided with the comb electrodes having 150 electrode fingers. However, like advantageous effect of suppressing the spurious responses to the transverse mode resonances is also achievable by making parallel connection between the first surface acoustic wave resonator and the second surface acoustic wave resonator, even when at least one of these comb electrodes has 150 or less number of the electrode fingers.

Second Exemplary Embodiment

Figure 4:
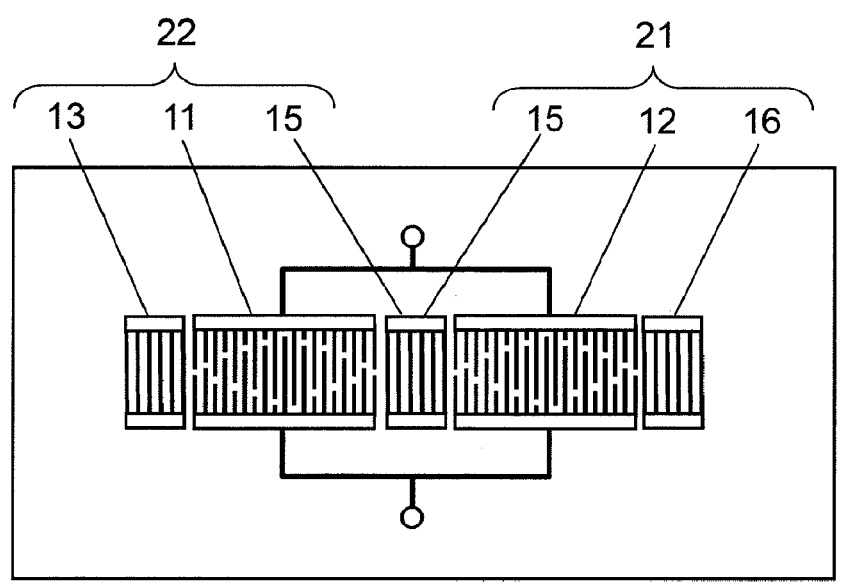
FIG. 4 is a plan view of a surface acoustic wave resonator according to a second exemplary embodiment of the present invention.

FIG. 4 shows a plan view of a surface acoustic wave resonator according to the second exemplary embodiment of the present invention.

The surface acoustic wave resonator of this invention has a structure, in which either reflector 14 or reflector 15 between comb electrodes 11 and 12 shown in FIG. 1 is eliminated, so that the remaining element designated as reflector 15 is used to serve commonly for both comb electrodes 11 and 12. In other words, first surface acoustic wave resonator 21 and second surface acoustic wave resonator 22 share a function of reflector 15 provided between them. This structure allows further reduction in size of the surface acoustic wave resonator as compared to the one shown in FIG. 1 of the first exemplary embodiment.

Figure 5A:
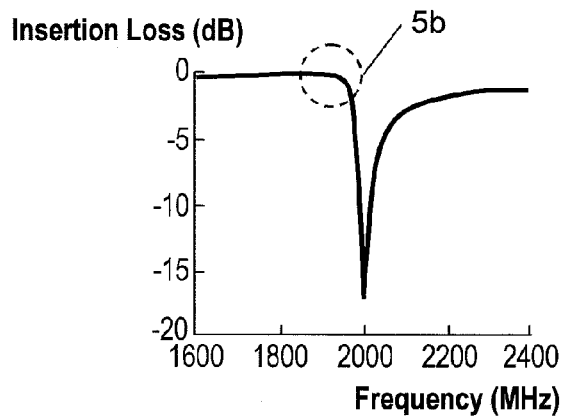
FIG. 5A is a pass-band characteristic of the surface acoustic wave resonator according to the second exemplary embodiment of the present invention.
Figure 5B:
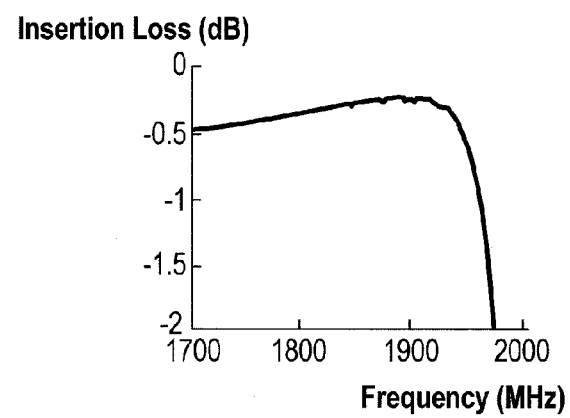
FIG. 5B is a part of the pass-band characteristic, wherein domain 5b encircled by a dotted line in FIG. 5A is enlarged.

FIG. 5A shows a pass-band characteristic of this surface acoustic wave resonator, and FIG. 5B shows a part of the pass-band characteristic, wherein domain 5b encircled by a dotted line in FIG. 5A is enlarged.

As is apparent from FIG. 5A and FIG. 5B, it is known that the surface acoustic wave resonator of this second exemplary embodiment shown in FIG. 4 can also suppress spurious responses due to the resonance in the transverse mode to the same extent as the first exemplary embodiment.

Third Exemplary Embodiment

Figure 6:
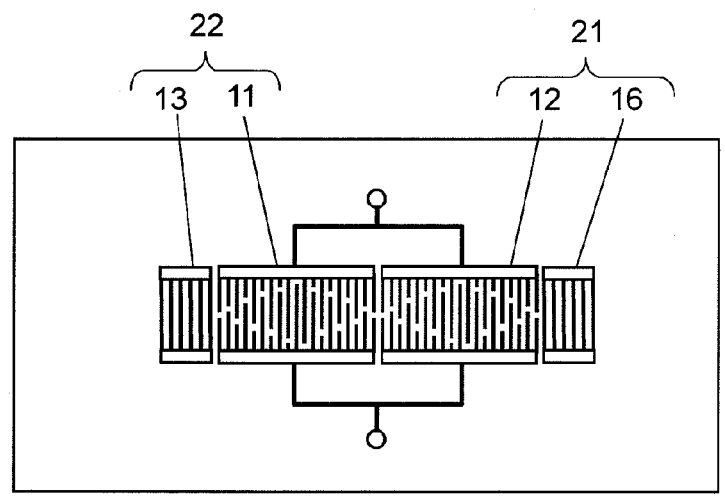
FIG. 6 is a plan view of a surface acoustic wave resonator according to a third exemplary embodiment of the present invention.

FIG. 6 shows a plan view of a surface acoustic wave resonator according to the third exemplary embodiment of the present invention.

The surface acoustic wave resonator of this invention has a structure, in which both reflectors 14 and 15 located between comb electrodes 11 and 12 shown in FIG. 1 are eliminated, and comb electrodes 11 and 12 are disposed close to each other. In other words, first surface acoustic wave resonator 21 and second surface acoustic wave resonator 22 share functions of reflectors 13 and 16 that sandwich comb electrodes 11 and 12 between them. This structure allows even further reduction in size of the surface acoustic wave resonator as compared to those discussed in the first and the second exemplary embodiments.

Figure 7A:
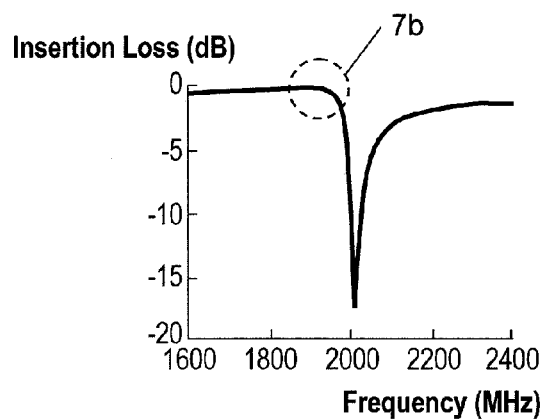
FIG. 7A is a pass-band characteristic of the surface acoustic wave resonator according to the third exemplary embodiment of the present invention.
Figure 7B:
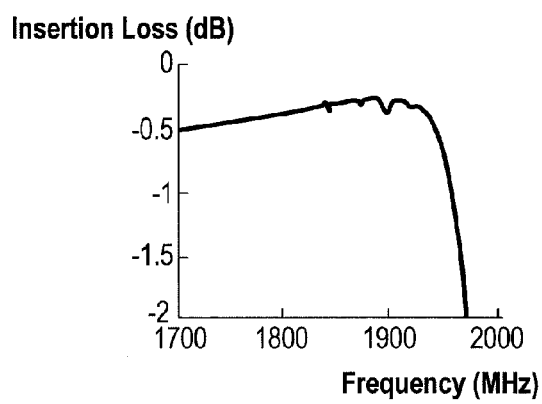
FIG. 7B is a part of the pass-band characteristic, wherein domain 7b encircled by a dotted line in FIG. 7A is enlarged.
Figure 8:
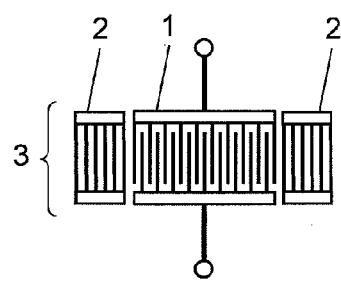
FIG. 8 is a plan view of a conventional surface acoustic wave resonator provided with normal type electrodes.
Figure 9A:
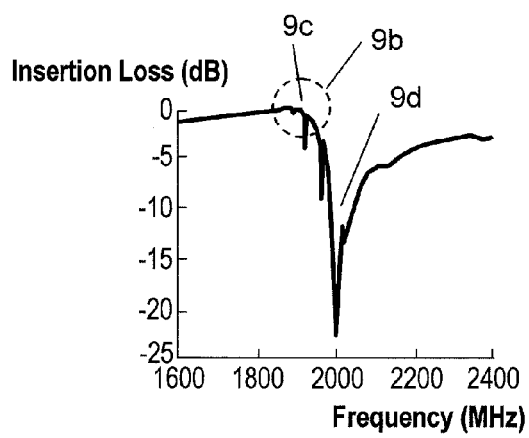
FIG. 9A is a pass-band characteristic showing insertion loss versus frequency of the surface acoustic wave resonator of FIG. 8.
Figure 9B:
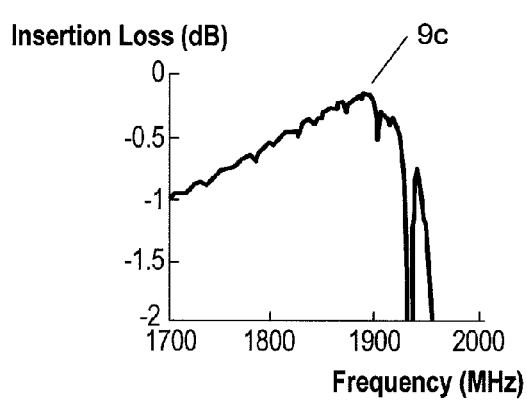
FIG. 9B is a part of the pass-band characteristic of the surface acoustic wave resonator, wherein domain 9b encircled by a dotted line in FIG. 9A is enlarged.
Figure 10:
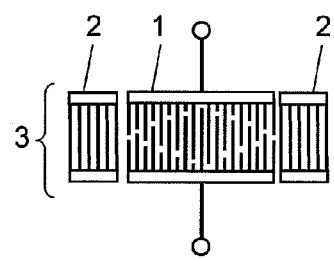
FIG. 10 is a plan view of another conventional surface acoustic wave resonator.

FIG. 7A shows a pass-band characteristic of this surface acoustic wave resonator, and FIG. 7B shows a part of the pass-band characteristic, wherein domain 7b encircled by a dotted line in FIG. 7A is enlarged.

As is apparent from FIG. 7A and FIG. 7B, it is also known that the surface acoustic wave resonator of this third exemplary embodiment shown in FIG. 6 can suppress spurious responses due to the resonance in the transverse mode to the similar extent as the first and the second exemplary embodiments.

It should be noted that the numbers of the electrode fingers of comb electrodes 11 and 12 shown in the first through the third exemplary embodiments are illustrative and not restrictive, and that like advantageous effects are also achievable as long as first surface acoustic wave resonator 21 and second surface acoustic wave resonator 22 are apodized by respective weights and connected in parallel.

It should also be noted with regard to the apodization by weights that the comb electrodes are apodized in the configuration that overlapping lengths of the interdigitated electrode fingers are gradually reduced from the largest at the center toward both ends of the resonators where the electrode fingers are not overlapped, but this configuration is just illustrative and not restrictive. The structure can be optimized to obtain the most suitable surface acoustic wave resonator by varying levels of the weights with consideration given to a magnitude of the spurious responses in the transverse mode.

Although the first through the third exemplary embodiments show the structures comprising first surface acoustic wave resonator 21 and second surface acoustic wave resonator 22 connected in parallel, this invention is also applicable to a structure having three or more resonators in parallel connection rather than just two.

Furthermore, numbers of the electrode fingers and their configurations as well as weights placed on comb electrodes 11 and 12 may be designed differently between first surface acoustic wave resonator 21 and second surface acoustic wave resonator 22 though the above embodiments have shown them as being identical in their configurations.

The surface acoustic wave resonator provided by this invention features superior suppression of spurious responses even with a large number of the comb electrode fingers in the aggregate, has a predetermined value of electrostatic capacitance and a low insertion loss while also achieving a reduction in size. This resonator is therefore suitable as an electronic component for use in any kind of electronic apparatus, and contributable to improvement of the performance and downsizing of the electronic apparatus.

The invention claimed is:

1. A surface acoustic wave resonator, comprising:
   a piezoelectric substrate;
   a first surface acoustic wave resonator having a comb electrode provided on the piezoelectric substrate; and
   a second surface acoustic wave resonator having a comb electrode provided on the piezoelectric substrate,
   wherein the first surface acoustic wave resonator and the second surface acoustic wave resonator are apodized and connected in parallel, and
   an overlapping length of the comb electrode of the first surface acoustic wave resonator is different from an overlapping length of the comb electrode of the second surface acoustic wave resonator.

2. The surface acoustic wave resonator of claim 1, wherein the piezoelectric substrate is formed of $LiNbO_3$.

3. The surface acoustic wave resonator of claim 1, wherein the piezoelectric substrate is formed of a rotated Y-cut substrate of $LiNbO_3$ having a cut angle in a range of −5 to +30 degrees, and a dielectric layer is formed on the comb electrodes of the first surface acoustic wave resonator and the second surface acoustic wave resonator.

4. The surface acoustic wave resonator of claim 1, wherein the first surface acoustic wave resonator and the second surface acoustic wave resonator share at least one reflector.

5. The surface acoustic wave resonator of claim 1, wherein at least one of the comb electrodes of the first surface acoustic wave resonator and the second surface acoustic wave resonator has 150 or less in number of electrode fingers.

\* \* \* \* \*